(12) United States Patent
Ninomiya et al.

(10) Patent No.: US 8,735,855 B2
(45) Date of Patent: May 27, 2014

(54) ION BEAM IRRADIATION SYSTEM AND ION BEAM IRRADIATION METHOD

(75) Inventors: Shiro Ninomiya, Tokyo (JP); Toshio Yumiyama, Tokyo (JP); Yasuhiko Kimura, Tokyo (JP); Tetsuya Kudo, Tokyo (JP); Akihiro Ochi, Tokyo (JP)

(73) Assignee: SEN Corporation, Tokyo (JP)

( * ) Notice: Subject to any disclaimer, the term of this patent is extended or adjusted under 35 U.S.C. 154(b) by 0 days.

(21) Appl. No.: 13/154,913

(22) Filed: Jun. 7, 2011

(65) Prior Publication Data

US 2011/0297842 A1 Dec. 8, 2011

(30) Foreign Application Priority Data

Jun. 7, 2010 (JP) ................................. 2010-130378

(51) Int. Cl.
*H01J 3/26* (2006.01)

(52) U.S. Cl.
USPC ................................ 250/492.22; 250/492.21

(58) Field of Classification Search
USPC ......................................... 250/492.1–492.23
See application file for complete search history.

(56) References Cited

U.S. PATENT DOCUMENTS

| | | | | |
|---|---|---|---|---|
| 5,418,378 | A * | 5/1995 | Friede et al. | 250/492.21 |
| 7,342,239 | B2 * | 3/2008 | Peng | 250/492.21 |
| 7,851,772 | B2 | 12/2010 | Tsukihara et al. | |
| 2003/0205328 | A1 * | 11/2003 | Kinnard et al. | 156/345.37 |
| 2006/0097196 | A1 * | 5/2006 | Graf et al. | 250/492.21 |
| 2006/0163498 | A1 * | 7/2006 | Yoneda et al. | 250/492.21 |
| 2007/0120073 | A1 * | 5/2007 | Peng | 250/492.21 |
| 2007/0221872 | A1 * | 9/2007 | Olson et al. | 250/492.21 |
| 2008/0251737 | A1 * | 10/2008 | Tsukihara et al. | 250/492.21 |
| 2012/0252194 | A1 * | 10/2012 | Ninomiya et al. | 438/514 |

FOREIGN PATENT DOCUMENTS

| | | |
|---|---|---|
| JP | S 6166355 A | 4/1986 |
| JP | H 05135730 A | 6/1993 |
| JP | 2548948 Y2 | 5/1997 |
| JP | 2003533850 A | 11/2003 |
| JP | 2008-262756 A | 10/2008 |

OTHER PUBLICATIONS

Japanese Office Action corresponding to JP 2010-130378 dated Jun. 19, 2013.

* cited by examiner

*Primary Examiner* — Jack Berman
*Assistant Examiner* — Wyatt Stoffa
(74) *Attorney, Agent, or Firm* — Arent Fox LLP

(57) ABSTRACT

An ion beam irradiation method comprises calculating a scan voltage correction function with the maximum beam scan width depending on the measurement result of a beam current measurement device, calculating each of more than one scan voltage correction functions corresponding to each of scheduled beam scan widths depending on the calculated scan voltage correction functions while satisfying dose uniformity in the horizontal direction, measuring a mechanical Y-scan position during the ion implantation, changing the scan voltage correction function as a function of the measured mechanical Y-scan position so that the beam scan area becomes a D-shaped multistage beam scan area corresponding to an outer periphery of a half of the wafer to thereby reduce the beam scan width, and changing a mechanical Y-scan speed depending on the change of the measurement result of a side cup current measurement device to thereby keep the dose uniformity in the vertical direction.

7 Claims, 8 Drawing Sheets

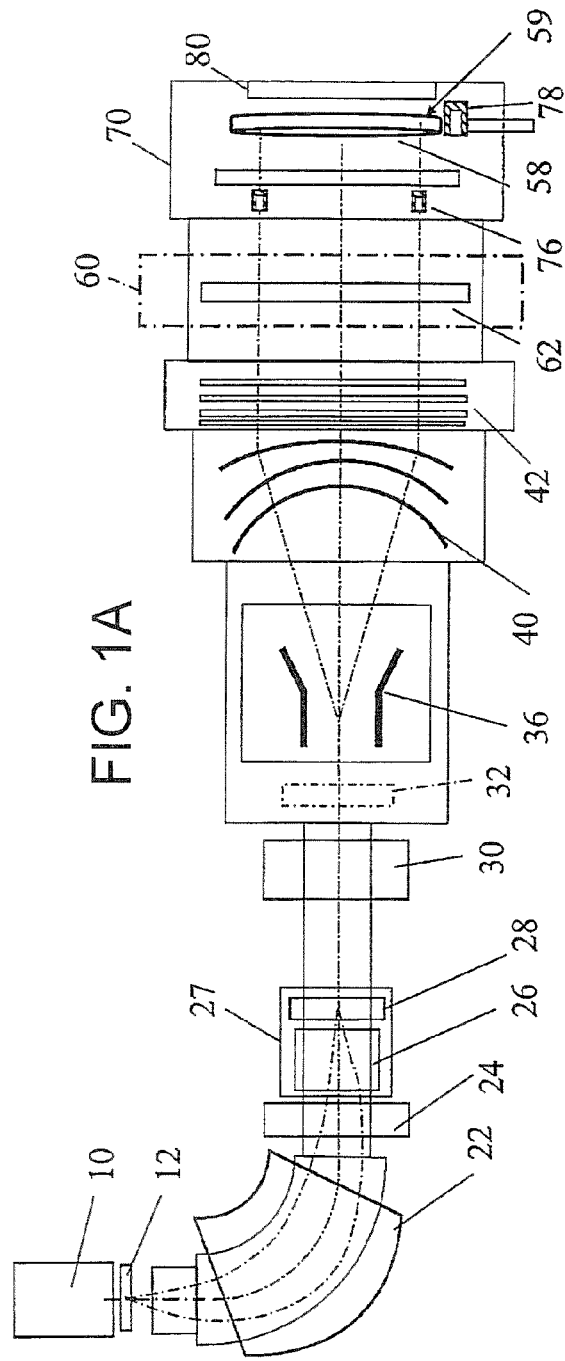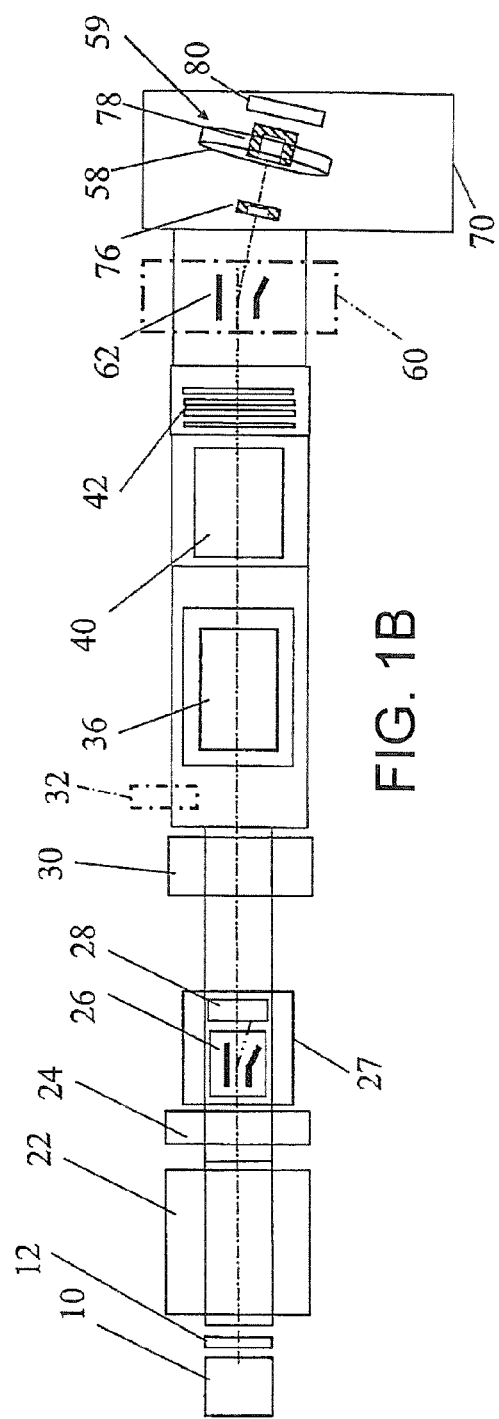

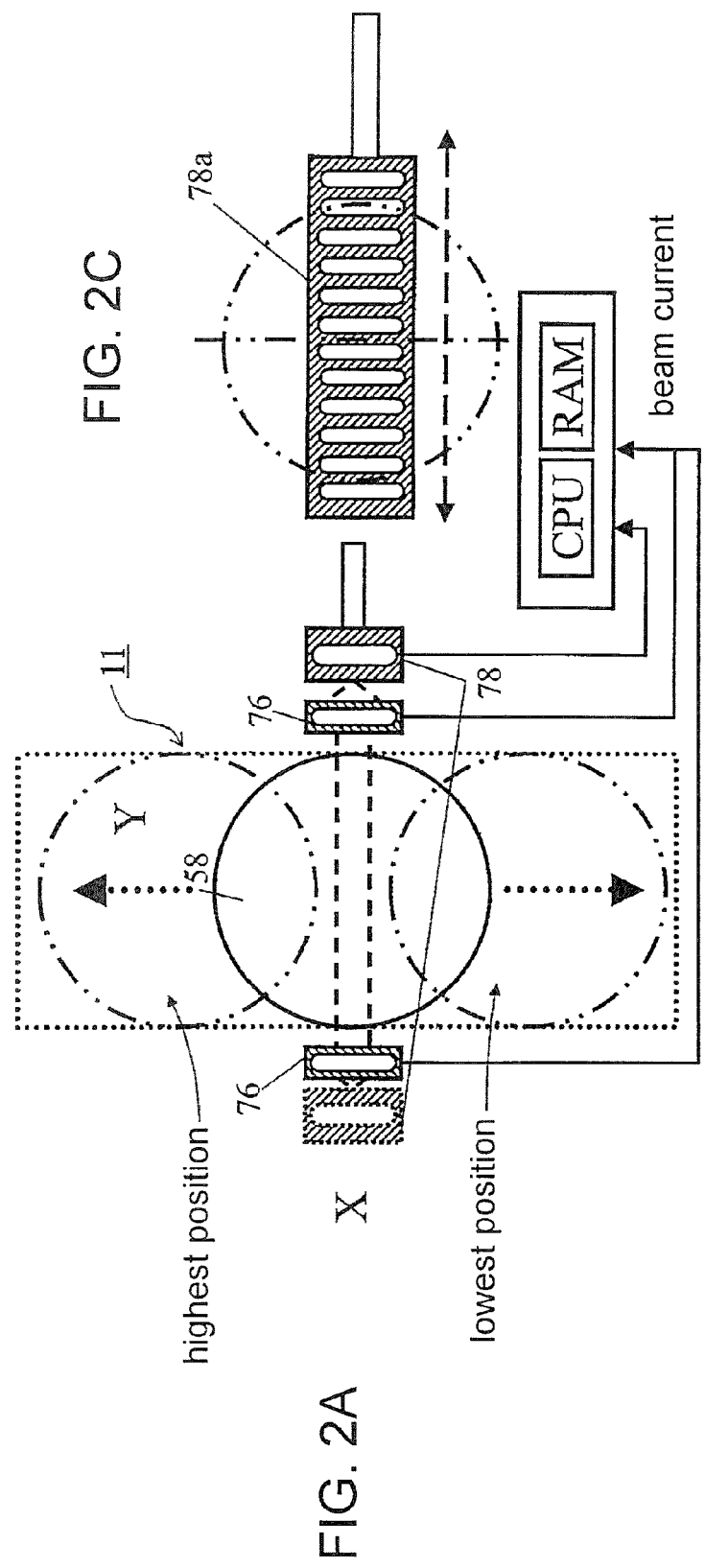
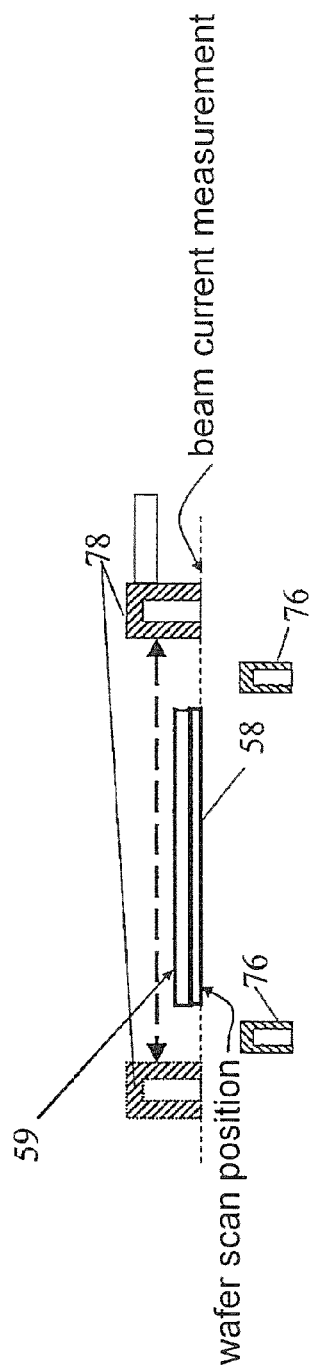
FIG. 2A
FIG. 2B
FIG. 2C

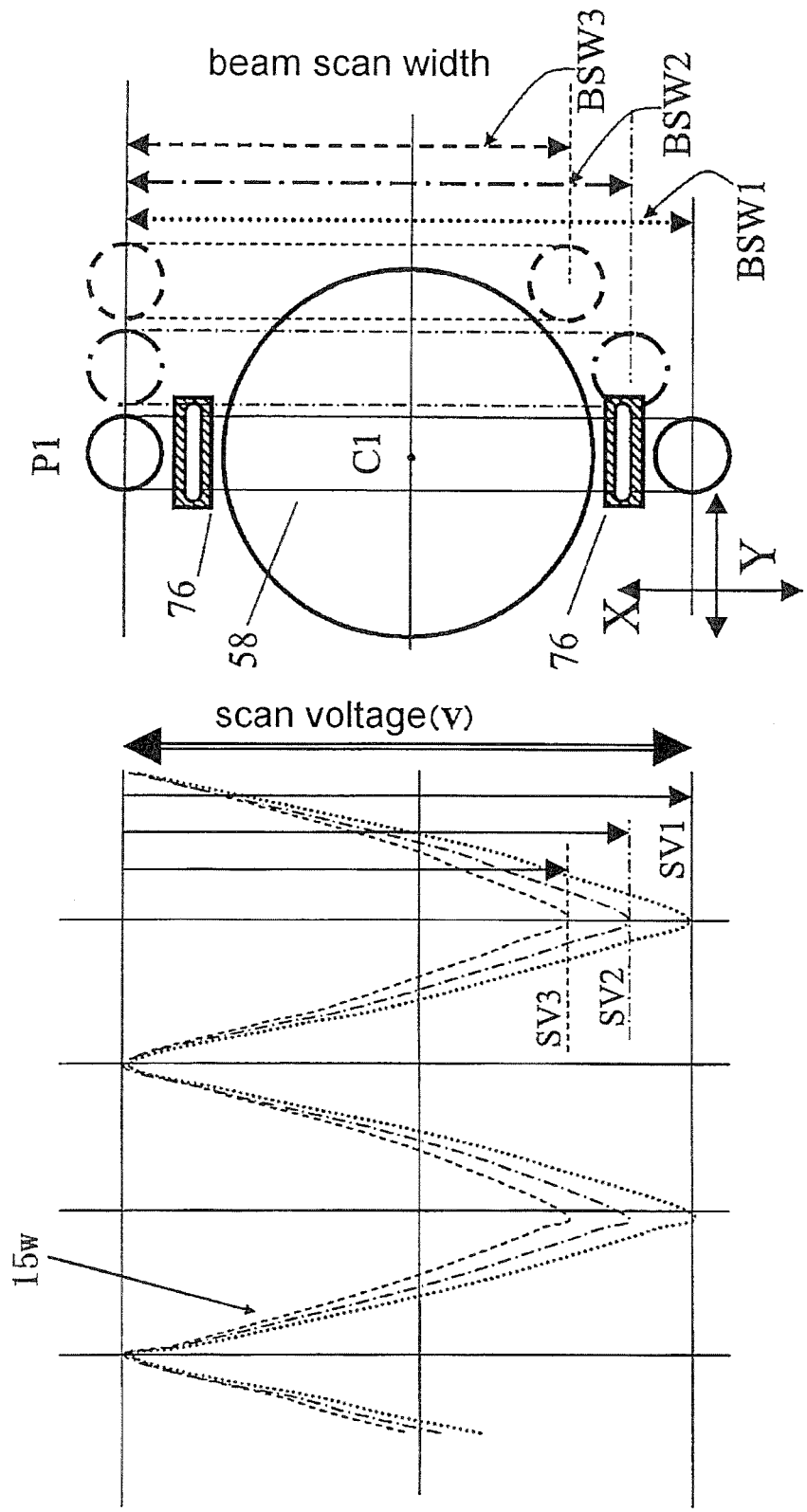

| initial basic set voltage value (v) | -5 | -4 | -3 | -2 | -1 | 0 | +1 | +2 | +3 | +4 | +5 |
|---|---|---|---|---|---|---|---|---|---|---|---|
| correction voltage value (v) | +0.3 | +0.2 | +0.2 | +0.1 | +0.1 | 0 | +0.1 | +0.1 | +0.2 | +0.2 | +0.3 |
| actual scan voltage value (v) | -4.7 | -3.8 | -2.8 | -1.9 | -0.9 | 0 | +1.1 | +2.1 | +3.2 | +4.2 | +5.3 |

ION BEAM IRRADIATION SYSTEM AND ION BEAM IRRADIATION METHOD

This application is based upon and claims the benefit of priority from Japanese patent application No. 2010-130378, filed on Jun. 7, 2010, the disclosure of which is incorporated herein its entirety by reference.

BACKGROUND OF THE INVENTION

This invention relates to an ion beam irradiation system and an ion beam irradiation method for use in a beam processing system using an ion beam or a charged particle beam.

An ion implanter is used in order to implant ions to a circular wafer for semi-conductor device. Generally, a beam generation source, an extraction electrode, a mass analysis magnet, a mass analysis slit, an acceleration/deceleration device, and a wafer treatment chamber are aligned to a beam line in an ion implanter.

Since a cross section of an ion beam is generally smaller than the size of the circular wafer, several methods have been proposed to irradiate such an ion beam to whole of the circular wafer.

As one of the examples for an ion beam irradiation method, it has been proposed that a wafer is scanned with an ion beam to one direction, for example, in a horizontal direction, by a beam deflection scanner for ion beam scan (hereinafter referred to as "fast scan", "beam scan", or "X scan") and a wafer is scanned (moved) to another direction which lies at right angles to the ion beam scan direction, i.e. a vertical direction, by a mechanical Y-scan device (hereinafter referred to as "slow scan" or "mechanical Y-scan"). A whole region of a wafer can be irradiated with the ion beam of a small cross-section size by such combinations of the beam scan and the mechanical Y-scan (see JP-A-2008-262756 (Patent Document 1)).

As shown in FIG. 8, in this type of irradiation method, the scanning width BSW (hereinafter referred to as "beam scan width") to the X-direction of the ion beam deflected by the deflection scanner is the same in any Y direction region. In other words, the beam scan width at both edges in the Y-direction of a wafer 58 is the same as that in a center region of the wafer 58.

In the irradiation method shown in FIG. 8, since useless ion beam irradiation to outside of the wafer 58 increases as the ion beam irradiation approaches both Y-direction edges of the wafer 58, the beam irradiation efficiency is restricted and hence the productivity of the wafer have some limitations.

As an example for reducing the useless ion beam irradiation to outside of the wafer, it has already been proposed to scan the ion beam with a serrate shape on a wafer (see Japanese Utility Model Registration No. JP-Y2-2548948 (Patent Document 2)).

It should be noted that uniform dose distribution in a whole region of the wafer (hereinafter referred to as "in-plane uniformity of dose amount") is always required in any ion beam irradiation method.

In the ion beam irradiation method disclosed in Patent Document 2, the wafer is two-dimensionally scanned with the ion beam so that whole irradiation region is reduced to increase beam irradiation efficiency. That is, the ion beam scan in one direction and the ion beam scan in an orthogonal direction are combined and carried out at the same time so that the irradiation region of the ion beam fits the shape of the wafer. In particular, it is configured so that a beam scan pitch of the beam scan becomes constant by configuring the beam scan width of each of the beam scans in one direction so that one direction beam scan, set like steps, is carried out with the same beam scan speed while changing scan period/frequency, while the beam scan speed of the beam scan in the orthogonal direction changes in synchronism with the change of the period of the one direction beam scan. In this irradiation method, although the beam irradiation efficiency can be improved, a target wafer is required to be fixedly set. Therefore, such an ion beam irradiation method can not be applied to an ion implanter which comprises reciprocating wafer moving function by a mechanical Y-scan device, as shown in Patent Document 1.

Further, in the ion beam irradiation method disclosed in Patent document 2, a small fluctuation of ion beam current during ion implantation to a wafer is ignored, which causes unexpected in-plane non-uniformity of the dose amount.

SUMMARY OF INVENTION

It is an object of this invention to provide an ion beam irradiation system and an ion beam irradiation method capable of not only increasing beam irradiation efficiency but also maintaining the in-plane dose uniformity of a wafer even when small fluctuation of ion beam current happens, for an ion implanter which comprises reciprocating wafer moving function by a mechanical Y-scan device.

Hitherto, in an ion beam scan process having a plurality of scan conditions, the technique that changes the beam scan speed in each of the scan conditions while maintaining the beam scan period in one direction and the technique that changes the beam scan speed according to each scan setting width (namely, the beam scan width) in one direction with a constant beam scan period are never been provided.

It is a specific object of this invention to realize the following.

1. Generate a plurality of same dose amount regions each having a plurality of combinations of the beam scan speed and the mechanical Y-scan speed, by keeping basic-frequency setting for a beam scan control calculation unit that performs the control of the beam scan and the mechanical Y-scan, by correcting and changing the voltage to be applied to a beam deflection scanner with a constant beam scan period, by providing a plurality of scan wave forms which are different in beam scan speed setting, and then by configuring so as to generate a plurality of beam scan regions which are different in combination of the beam scan speed and the beam scan width.

2. Generate scan voltage correction functions for the beam deflection scanner, by carrying out calculation, from a basic beam scan control function, in accordance with the beam scan width and with the condition of a fixed beam scan period.

3. Generate multistage setting beam scan regions which are different in beam scan width with respect to the Y-direction of the wafer in the condition that the in-plane dose uniformity of the wafer was satisfied.

4. The follow-up to the beam fluctuation/dose amount fluctuation can surely be executed.

5. Improve the productivity (time reduction of ion beam irradiation process step) and the energy saving performance, and reduce the useless ion beam irradiation (reduce the sputtering contamination).

This invention is applied to an ion beam irradiation system comprising an ion source, a mass analysis magnet, a mass analysis slit, a beam deflection scanner, a beam parallelizing device, and a wafer processing chamber, which are arranged in order so as to form a beam line. In the ion beam irradiation system, an ion beam extracted from a beam extraction electrode is transferred through the beam line and irradiated onto a wafer mounted on a platen. The beam deflection scanner scans the wafer with the ion beam in a X direction that is a horizontal direction. The platen is moved in a Y direction that is a vertical direction with a wafer mechanical scan device installed in the wafer processing chamber. At least one of side cup current measurement device is arranged at an upstream side of the wafer to measure a beam current with the beam scan in the X direction while a beam current measurement device is arranged in the vicinity of an ion implantation position to the wafer in order to measure a beam current at the ion implantation position.

According to an aspect of this invention, the beam deflection scanner is controlled with a beam scan control calculation unit. The beam scan control calculation unit is configured so that a basic beam scan control function and a scan voltage correction function are changeable depending on the beam measurement result of the beam current measurement device. The basic beam scan control function and the scan voltage correction function are for controlling a beam scan speed in the beam deflection scanner with the scan voltage. The beam scan control calculation unit is configured so as to drive the wafer mechanical scan device with the mechanical scan speed corresponding to a set beam current, depending on the beam measurement result of the side cup current measurement device and so as to form multistage scan areas which are different in beam scan speed of the X direction and in beam scan width of the X direction, by setting more than one beam scan waveforms of the X direction which are different in beam scan speed while keeping a basic frequency set value in the beam scan control calculation unit with a constant. The more than one beam scan waveforms are set with generating scan voltage correction functions by correcting the scan voltages applied to the beam deflection scanner. The beam scan control calculation unit is further configured so as to form a plurality of same dose amount areas by using a combination of different beam scan speeds in the X direction and different mechanical scan speeds in the Y direction.

According to another aspect of this invention, the beam scan control calculation unit forms the multistage scan areas which are different in beam scan width so as to correspond to an outer periphery of a half of the wafer which are divided two with respect to a diameter in the Y direction to thereby reduce the beam scan width.

According to further aspect of this invention, an ion beam irradiation method for use in the ion beam irradiation system mentioned above is provided. The method comprises calculating, after completion of beam tuning, a scan voltage correction function with the maximum beam scan width, depending on the beam measurement result of the beam current measurement device, and automatically calculating each of more than one scan voltage correction functions corresponding to each of scheduled beam scan widths depending on the calculated scan voltage correction functions while satisfying dose uniformity in the horizontal direction. The method further comprises measuring a mechanical Y-scan position in the Y direction during the ion implantation, and changing the scan voltage correction function as a function of the measured mechanical Y-scan position so that the beam scan area becomes a D-shaped multistage beam scan area corresponding to an outer periphery of a half of the wafer which are divided two with respect to a diameter in the Y direction to thereby reduce the beam scan width and keep the dose uniformity in the horizontal direction. The method still further comprises measuring the beam current, in parallel with the above operations, in a constant scan area including another half of the wafer with the side cup current measurement device, and changing a mechanical Y-scan speed in the Y direction depending on the change of the measured beam current measured with the side cup current measurement device to thereby keep the dose uniformity in the vertical direction.

According to this invention, it is possible to form the multistage setting beam scan area corresponding to fine ion implantation conditions in which the beam scan period is a constant and a combination between the beam scan speed in the X direction and the mechanical Y-scan speed in the Y direction is different. Moreover, during the ion implantation, the beam current is measured with the side cup current measurement device and the wafer mechanical scan device is driven with the mechanical Y-scan speed in the Y direction corresponding to the setting beam current depending on the measurement result of the side cup current measurement device. As a result, it is possible to execute follow-up control which can be dealt with the beam fluctuation/dose amount fluctuation and to carry out uniformly ion implantation with satisfying the in-phase dose uniformity of the wafer.

According to this invention, it is also possible to form the multistage setting beam scan area in which the beam scan period is constant and the beam scan speed in the X direction, the mechanical Y-scan speed in the Y direction, and the beam scan width are different. Moreover, it is possible to execute follow-up control which can be dealt with the beam fluctuation/dose amount fluctuation and to carry out uniformly ion implantation with satisfying the in-phase dose uniformity of the wafer.

According to this invention, since the D-shaped beam scan area is adopted to match the shape of the wafer, it is possible to increase the productivity of the wafer by reduction of the beam scan area (ion beam irradiation area) with keeping the in-plane dose uniformity, relative to the conventional rectangular beam scan area explained in FIG. 8.

According to this invention, since the shape of the scan area is determined in consideration of the shape of the wafer, it is possible to reduce the beam scan area (ion beam irradiation area) with keeping the in-plane dose uniformity and to improve the beam utilization efficiency by reduction of ion beam quantity which is irradiated outside of the wafer, relative to the conventional rectangular beam scan area explained in FIG. 8. Thus, it is possible to reduce the electric power consumption consumed in manufacturing one semiconductor product and to reduce the raw material such as a gas or the like consumed in manufacturing one semiconductor product.

According to this invention, since the shape of the scan area is determined in consideration of the shape of the wafer, it is possible to reduce the beam scan area (ion beam irradiation area) with keeping the in-plane dose uniformity and to reduce the useless ion beam irradiation by reduction of ion beam quantity which is irradiated outside of the wafer, relative to the conventional rectangular beam scan area explained in FIG. 8. Thus, it is possible to reduce the amount of the ions, except for the required ion species, which are caused by the sputtering of the useless ion beam irradiation to be implanted to the wafer.

BRIEF DESCRIPTION OF THE DRAWINGS

FIGS. 1A and 1B are diagrams showing a schematic structure of an ion implanter to which this invention is applied;

FIGS. 2A to 2C are diagrams showing one example of a schematic structure of a beam scan control system according to this invention;

FIGS. 4A and 4B are diagrams for explaining a corrected scan voltage (actual scan voltage) of the beam deflection scanner for ion beam scan and a beam scan width;

DESCRIPTION OF THE EXEMPLARY EMBODIMENTS

Figure 3B:
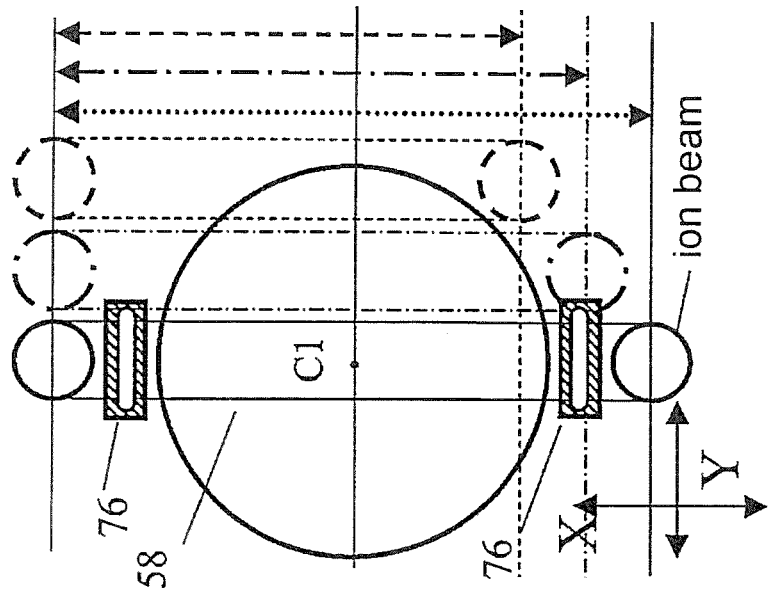
FIGS. 3A and 3B are diagrams for explaining a scan voltage of a beam deflection scanner for ion beam scan and a beam scan width.

Description will be made in regard to an exemplary embodiment of this invention with reference to FIGS. 1A and 1B. In an ion beam irradiation system or an ion implanter to which this invention is applied, an ion beam is extracted by an extraction electrode from a beam generation source, and is transferred to a wafer along a so-called beam line, which is composed of a mass analysis magnet, a mass analysis slit, a beam deflection scanner for ion beam scan, and a wafer treatment chamber. In the wafer treatment chamber, a mechanical Y-scan device with a platen for holding a wafer is installed. At an upstream section of a wafer on the beam line and a vicinity section of a wafer (immediately upstream and downstream positions and an ion implantation position), a side cup current measurement device and a beam current measurement device at an ion implantation position are installed. These current measurement devices are of a fixed measurement type or a movable measurement type. In the movable measurement type, the measurement device is moved between the ion implantation position or a wafer mechanical scan position and an evacuation position.

A beam transforming (or shaping) device and a beam track adjusting device are installed between the mass analysis slit and the beam deflection scanner for ion beam scan, as necessary. A beam parallelizing device, an acceleration/deceleration device, and an angular energy filter (AEF) are installed between the beam deflection scanner and the wafer treatment chamber, as necessary.

FIGS. 1A and 1B show a single wafer type ion implanter comprising a beam deflection scanning device 36 (hereinafter referred to as "beam deflection scanner") of an electrostatic type (or a magnetic type) and al beam parallelizing device (beam parallelizing lens or parallel lens, hereinafter referred to as "parallel lens") of an electrostatic type. FIG. 1A and FIG. 1B are a plan view and a side view of the ion implanter, respectively. Typical structure of such an ion implanter will be explained in brief from the most upstream side of the beam line, namely, from a beam generation source 10 which is a starting point.

An extraction electrode 12 is installed at an exit of a beam generation source 10 to accelerate and extract ions from plasma formed in the beam generation source 10. An ion beam extracted from the beam generation source 10 is transferred along a beam line to a wafer set at an ion implantation position in a wafer treatment chamber. At the downstream side of the extraction electrode 12, a mass analysis magnet 22 is installed to separate an objective ion species from the extracted ion beam and to form ion beam with the objective ion species. At the downstream side of the mass analysis magnet 22, a first vertically focusing DC quadrupole electromagnet QD 24, a park electrode 26 to rapidly deflect/temporarily evacuate the ion beam in the direction that comes off from the beam line, a mass analysis slit 28 to pass only an ion beam comprising ions having a required mass, and a second vertically focusing DC quadrupole electromagnet QD 30 are installed in order. The park electrode 26 and the mass analysis slit 28 are contained in a park housing 27. At the downstream side of the second vertically focusing DC quadrupole electromagnet QD 30, a Faraday cup 32 is installed to cut off the ion beam and to measure a total beam current, as necessary, by bringing in and out the Faraday cup 32 to and from the beam line. At the downstream side of the Faraday cup 32, an electrostatic type (or a magnetic type) beam deflection scanner 36 is installed to periodically and reciprocally scan the ion beam in a lateral (horizontal) direction orthogonal to a travelling direction of the ion beam. Thus, the ion beam is deflected so that it has an angle with respect to the horizontal direction orthogonal to a beam line direction.

With an electrostatic type (or a magnetic type) parallel lens 40, the ion beam is re-deflected so that it becomes parallel to the travelling direction (beam line direction) of the ion beam at the position of the upstream side of the beam deflection scanner 36 (before deflection). That is, the ion beam deflected by the beam deflection scanner 36 is parallelized in the beam line direction with electric field generated by more than one electrode of the parallel lens 40. At the downstream side of the beam deflection scanner 36, the parallel lens 40 and an acceleration/deceleration column (electrode) 42 comprised of more than one electrode are installed.

The ion beam passed through the parallel lens 40 is adjusted with the acceleration/deceleration column 42 so as to have required beam energy (electrostatic acceleration/deceleration energy) and transferred to a hybrid type angular energy filter 60 (hereinafter referred to as "AEF"). The acceleration/deceleration column 42 is comprised of linear shape electrodes and accelerates/decelerates the ion beam by adjusting the voltage applied to the linear shape electrodes. The AEF 60 arranged at the downstream side of the acceleration/deceleration column 42 executes analysis with respect to the energy of the ion beam and selects ion species having required energy. That is, the AEF 60 selects the ion beam having the required acceleration/deceleration energy. For this purpose, the AEF 60 is comprised of an electromagnet for magnetic deflection and an electrostatic electrode for electrostatic deflection. The electromagnet for magnetic deflection is attached around an AEF chamber so as to surround left, right, top, and bottom thereof and is comprised of yoke members surrounding the left, right, top, and bottom of the AEF chamber and left, right, top, and bottom coil groups wound around the respective yoke members. The electrostatic electrode for electrostatic deflection is comprised of a pair of AEF electrodes 62 located at upper side and lower side of the ion beam. When the magnetic deflection is executed, the ion beam is deflected downward by about 10 to 30 degrees by the magnetic field from the electromagnet for the magnetic deflection and thereby only the ion beam having the required energy is selected. When the electrostatic deflection is executed, the ion beam is deflected downward as the same as the magnetic deflection with the static electric field generated by the pair of AEF electrodes 62 and thereby only the ion beam having the required energy is selected.

A wafer treatment chamber (ion implantation process chamber) 70 is connected to the AEF chamber. A selectable energy slit (hereinafter referred to as "SES") and an electron supplying device using plasma (hereinafter referred to as "plasma shower") (both of which are not shown) are installed in the wafer treatment chamber 70. The SES has several slit plates each having a slit and reduces cross contamination by changing the slit plate according to the ion species. The plasma shower supplies low energy electrons to a front surface of a wafer 58 together with the ion beam and neutralizes and suppresses the charge-up of the positive charges generated by the ion implantation. At a section near to left and right ends of the plasma shower and upstream of the wafer 58, which is in the wafer treatment chamber 70, side cups (dose cup) 76 are arranged so as to locate the positions corresponding to both ends in horizontal direction of the wafer 58. The side cups 76 measure a beam current (dose amount) even when the ion implantation is executed. Specifically, the side cups 76 are connected to a current measuring circuit. Since the ion beam entered into the side cups 76 is neutralized with electrons flowing in the current measuring circuit, the beam current (dose amount) can be measured by measuring the flow of the electrons.

At a section near to the wafer 58, which is the ion implantation position, a beam current measurement device 78 is installed. The beam current measurement device 78 comprises a beam profiler cup that measures the beam current and measures the beam shape in the scanning direction. That is the beam current measurement device 78 comprises a beam profiler cup provided with oval or rectangle shape beam injection openings and is constituted by a measurement member of a movable measurement type 78 (FIGS. 2A and 2B) having a single column beam profiler cup or a measurement member of a fixed measurement type 78a (FIG. 2C) having multi column beam profiler cup groups.

The beam current measurement device 78 of the movable measurement type is normally evacuated from the beam scan position. Before the ion injection or the like, the beam current measurement device 78 measures ion beam density (beam current density) at each of the horizontal ion implantation positions (several dozen through several thousand positions or more) and a beam profile in the horizontal direction of the ion beam while moving it from the evacuated position in the horizontal direction so as to orthogonal to the ion beam which is scanned on the beam scan region. In the beam current measurement device 78a of the fixed measurement type, it is normally evacuated from the beam scan position. To the ion beam which is scanned on the beam scan region, the beam current measurement device 78a measures ion beam density (beam current density) at each of the cup positions (several dozen through several thousand positions or more) of the multi-column beam profiler cup groups on the horizontal ion implantation positions and measures a beam profile in the horizontal direction of the ion beam, by changing it from the evacuated position to the beam scan position. As a result of the beam current measurement, if the beam current uniformity in the beam scan direction on the horizontal direction is not matched to fabrication requirements of a semiconductor device, some beam line parameters, such as scan voltages of the beam deflection scanner 36 and the magnetic flux density of the mass analysis magnet 22, are automatically adjusted so as to match to the fabrication requirements, and after that, the beam current density of the scanned beam is again measured by using the beam current measurement device 78 at the injection position, as necessary. At the most downstream position of the beam line, a tuning Faraday cup 80 is installed. The tuning Faraday cup 80 has a total beam current measurement function as the same as a Faraday cup known in the art and measures a final set up beam at a rear position of the ion implantation position.

The wafer 58 is set to a platen 59 (FIG. 2B) in a mechanical Y-scan device (vertical moving device) 11 (FIG. 2A). The wafer 58 is moved with the mechanical Y-scan device 11 up and down in the direction along the drawing as shown in FIG. 2A, and is moved together with the platen 59 on the mechanical Y-scan device 11 in the direction of a normal line to the drawing (FIG. 2B). Thus, when the wafer 58 is reciprocally scanned with the ion beam in one axial direction (e.g. horizontal direction), the wafer 58 is mechanically scanned to another direction, which is a right angled direction to the one axial direction (beam scan direction), with a wafer moving mechanism (not shown) in the mechanical Y-scan device 11.

FIG. 2A is a diagram for explaining ion injection to the wafer 58, using both the ion beam scan by the beam deflection scanner 36 and the mechanical Y-scan with the mechanical Y-scan device 11. As described before, the wafer 58 is mechanically scanned (mechanically moved up and down) by the mechanical Y-scan device 11 having the platen 59 which holds the wafer 58.

The mechanical Y-scan device 11 comprises a central processing unit (hereinafter referred to as "CPU") which totally controls ion beam irradiation and a random access memory (hereinafter referred to as "RAM") which memorizes a position of the wafer 58 in the mechanical Y-scan direction, as necessary. A pair of side cups 76 are installed at certain fixed positions in the beam scan region (herein, left and right positions of the mechanical Y-scan device 11) to measure a beam current (dose amount) and to output the measured value to the CPU.

In order to deal with the dose amount fluctuation/beam current fluctuation, namely, to keep the in-plane dose uniformity of the wafer, the CPU judges whether the dose amount is appropriate by using the measured value measured with at least one of the pair of side cups 76 and outputs the judgment result as a judgment signal for ion beam irradiation. Specifically, when the measured dose amount (beam current) is not smaller than a predetermined threshold value, the CPU outputs the judgment signal indicating that the dose amount is appropriate. When the measured dose amount is smaller than the predetermined threshold value, the CPU outputs the judgment signal (NG signal) indicating that the dose amount is inappropriate to rapidly interrupt the ion beam irradiation to the wafer 58 by the park electrode 26 (beam deflection device for beam evacuation) installed at the upstream side of the beam deflection scanner 36 or by the Faraday cup 32 (insertion type beam interruption device). In a case where the park electrode 26 is utilized, deflection voltage is applied to the park electrode 26 and thereby the ion beam is deflected with the park electrode 26 so as to deflect from a normal orbit of the ion beam. In a case where the Faraday cup 32 is utilized, the Faraday cup 32 is inserted into the beam line and thereby the ion beam is interrupted with the Faraday cup 32. After that, when some causes of dose amount fluctuation are removed, operation of the park electrode 26 or the Faraday cup 32 is cancelled and the beam current is measured again by the beam current measurement device 78 at the ion implantation position, as necessary, and the ion beam irradiation to the wafer 58 is restarted.

A wide broken arrow with a letter "X" in FIG. 2A shows the scanned ion beam with a maximum beam scan width. In this case, the wafer is reciprocally scanned with the ion beam so that the ion beam periodically cross a pair of side cups 76 in the horizontal direction (X direction) by the beam deflection scanner 36. Such a scan is called beam scan or X-scan. Moving of the wafer 58 is shown by dotted arrows with a letter "Y" in FIG. 2A. Since the wafer 58 is moved up and down (in the Y direction) while reciprocally scanning the ion beam in the horizontal direction (X direction), the ion beam reciprocally scans on the whole of the wafer 58. As a result, the ion of the scanned ion beam is injected on the whole of the wafer 58.

Specifically, when the wafer 58 is moved in the Y direction from the lowest position to the highest position or from the highest position to the lowest position, the ion is injected on the whole of the wafer 58.

In addition, as will be described later in detail, after completion of the start-up (e.g. beam tuning) of the ion implanter, there is a case that the scanned ion beam is no injected into the right side of the pair of side cups 76 during the ion beam irradiation to the wafer 58. This is because the beam scan width in the right-half side of the wafer 58 shown in FIG. 2A is adjusted so as to change along an outer periphery of the right-half of the wafer 58 (i.e. outer periphery of semicircle). In this case, one side of the pair of side cups 76 (i.e. the left side of the pair of side cups 76 in FIG. 2A) is used to measure the dose amount (beam current) during the ion beam irradiation to the wafer 58.

The basics in this invention will be explained in case of applying it to the ion implanters described above.

Firstly, a correction function of the scan voltage applied to the beam deflection scanner 36 will be explained with reference to FIG. 7.

As described above, it is much important for the ion implanters to keep the in-plane dose uniformity of the wafer. In the ion implanter that adopts the beam scan (X scan) as the first scan and the mechanical Y-scan (Y scan) as the slow scan, in order to keep the dose uniformity of the wafer in the horizontal direction (X direction), each beam scan voltage according to a control function of the scan voltage of the beam deflection scanner 36, that is a basic beam scan control function 14, is compensated or corrected based on the measured value of the beam current measurement device 78.

A function used in such a correction, which is applied to the beam deflection scanner 36, is called a "scan voltage correction function". By the scan voltage correction function, the corrected scan voltage which is actually applied to the beam deflection scanner 36 is defined by a beam scan voltage correction control function 15. The beam scan voltage correction control function 15 allows not only to keep the dose uniformity of the wafer in the horizontal direction (X direction) but also to set the beam scan width.

As to the dose uniformity of the wafer in the vertical direction (Y direction), the mechanical Y-scan speed is controlled during the ion beam irradiation in accordance with the set beam current and by the use of the measured value (beam current) measured with at least one of the pair of side cups 76 so as to correspond the dose amount correction caused by the beam fluctuation.

In this invention, a plurality of beam scan voltage correction control functions 15 are used to reduce the beam scan width in the right-half side of the wafer 58 shown in FIG. 2A in accordance with an outer periphery of the right-half of the wafer 58 (i.e. outer periphery of semicircle).

The above mentioned correction is executed by the use of the CPU shown in FIG. 2A as a beam scan control calculation unit that serves as a control part of a beam scan control system. The need for the above mentioned correction is as follows.

Referring to FIGS. 3A, 3B, 4A, and 4B, the relation between the beam scan width and the scan voltage of the beam deflection scanner 36 will be explained.

Figure 3A:
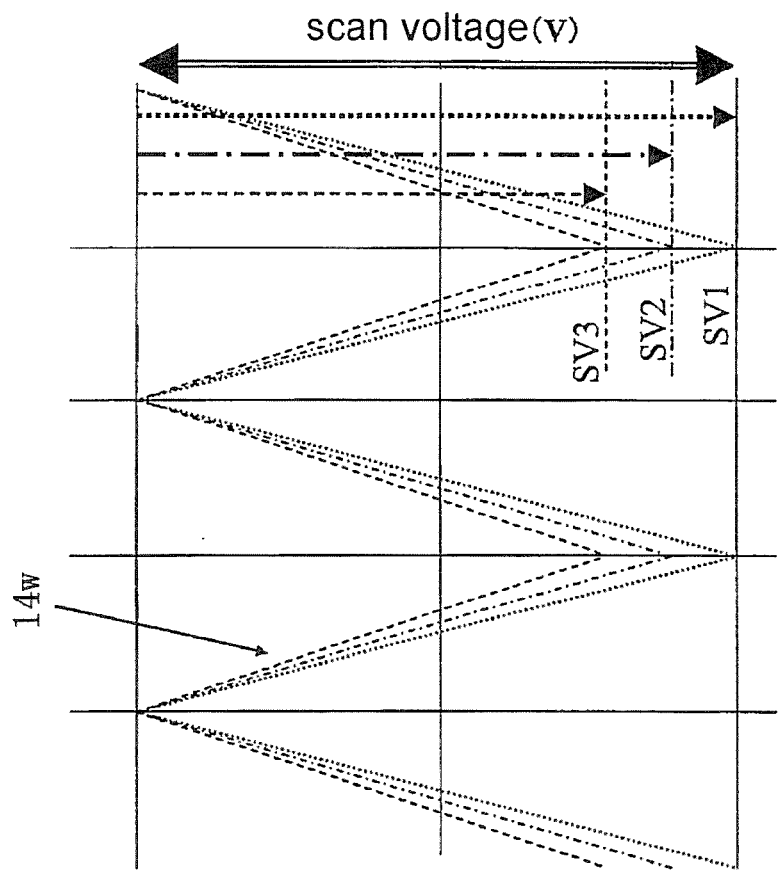

As shown in FIGS. 3A and 4A, the beam deflection scanner 36 is supplied with the scan voltage according to a corrected wave 15w (hereinafter referred to as "corrected triangle wave") (FIG. 4A) having a shape in which a triangle wave corrected based on a basic triangle wave 14w (FIG. 3A) according to the basic beam scan control function 14 and generated based on the beam scan voltage correction control function 15 is modulated (modulation correction). In other words, a basic scan voltage of the beam deflection scanner 36, which is a triangle wave 14w (FIG. 3A), is obtained by using the basic beam scan control function 14 as a control function. It is usually not enough, however, to obtain the expected dose uniformity of the wafer from fabrication requirements of semiconductor devices by using the triangle wave 14w as the scan voltage of the beam deflection scanner 36. Generally, in order to keep the dose uniformity of the wafer in the horizontal direction, the scan voltage of the beam deflection scanner 36 should be corrected so that a corrected triangle wave 15w can be obtained by using the beam scan voltage correction control function 15 as a control function. In addition, it is set so that the reciprocal scan (beam scan) is executed in many times with the corrected triangle wave of one kind. In FIGS. 3A and 4A, for brevity of explanation, a common potential is given as a standard value, three kinds of scan voltages which have the same period and are different in peak value are illustrated by a dotted line (peak value SV1), a chain line (peak value SV2), and a broken line (peak value SV3). The peak value SV1 is a maximum value of the scan voltage while the peak value SV3 is a minimum value of the scan voltage, and the peak values SV1-SV3 are defined by an inequality of SV1>SV2>SV3.

For example, by applying the corrected scan voltage illustrated by the dotted line (peak value SV1) in FIG. 4A, the beam deflection scanner 36 carries out the beam scan of the ion beam with a maximum beam scan width BSW1. As shown in FIG. 4B, the beam scan width is defined that a position P1 of the horizontal direction (X direction) is located outside one of the pair of side cups 76 (left side of FIG. 2A) and is a start position of the beam scan. Similarly, by applying the corrected scan voltage illustrated by the chain line (peak value SV2) in FIG. 4A, the beam deflection scanner 36 carries out the beam scan with a beam scan width BSW2 in which the position P1 is a start position. By applying the corrected scan voltage illustrated by the broken line (peak value SV3) in FIG. 4A, the beam deflection scanner 36 carries out the beam scan with a minimum beam scan width BSW3 in which the position P1 is a start position. The beam scan widths BSW1-BSW3 are defined by an inequality of BSW1>BSW2>BSW3.

Figure 5:
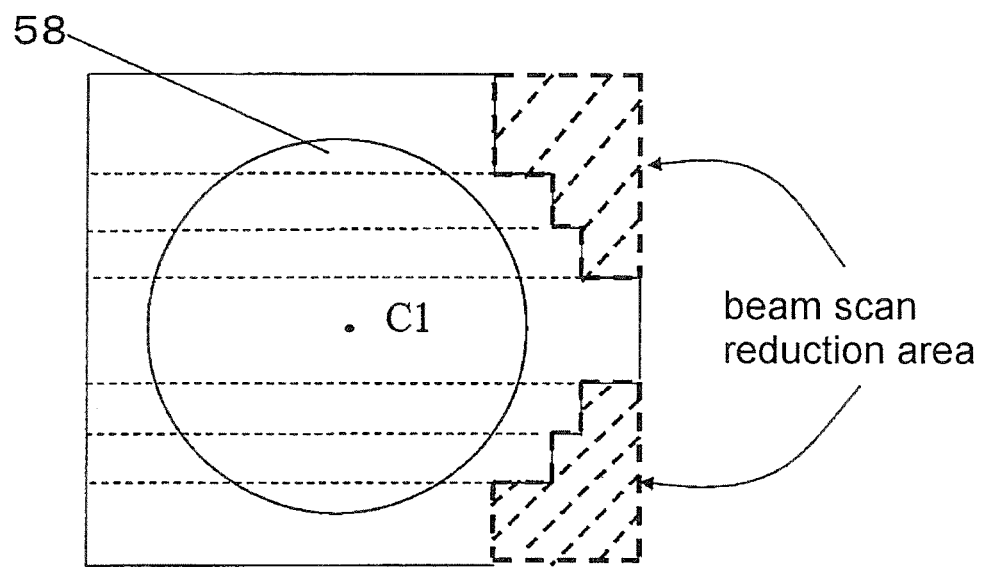
FIG. 5 is a diagram for explaining a "D" shape scan (irradiation) area according to this invention.

As shown in FIG. 5, by decreasing the beam scan width BSW step by step as a function of a distance in the Y direction from a center position C1 of the wafer 58, useless ion beam irradiation to outside of the wafer 58 is reduced. That is the beam scan width BSW is decreased step by step while parting from the center position C1 with respect to the Y direction. In other words, in order for reducing useless ion beam irradiation to outside of the wafer 58, the beam scan width of one side (for example, the right-half side in FIG. 5) is adjusted as a function of a Y-direction position of the wafer to the shape of a half of the wafer, that is a semicircle shape. Thus the beam scan width BSW in the right-half side of the wafer 58 is adjusted so as to change along an outer periphery of the right-half of the wafer 58 (i.e. outer periphery of semicircle). Hereinafter, this kind of beam scan method is called D-shaped beam scan from a shape of a beam scan area. In the D-shaped beam scan, even when the wafer 58 is moved in the Y direction, the wafer 58 is positioned within the reduced beam scan width.

Figure 6:
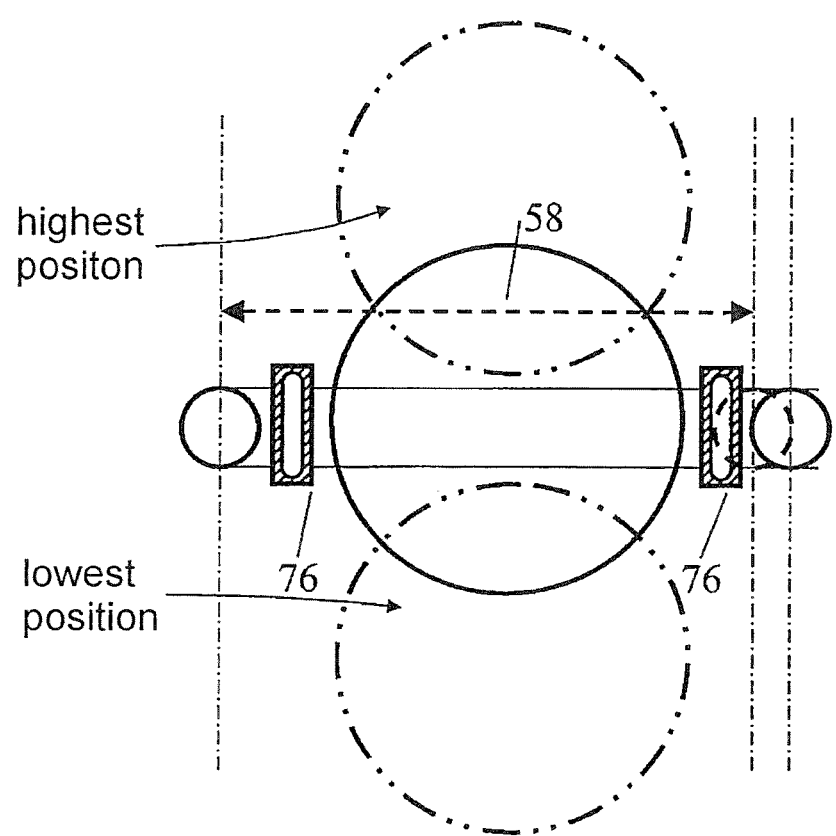
FIG. 6 is a diagram for explaining beam scan and mechanical Y-scan according to this invention.

In FIGS. 3B and 4B, to easily understand a relationship between the scan voltage and the beam scan width, the wafer 58 is illustrated in a state that it is fixed, at an intermediate position in the Y direction, on the plane in which the X direction is a vertical axis and the Y direction is a horizontal axis. In practice, as shown in FIG. 6 and as described before with reference to FIG. 8, the wafer 58 is reciprocally and mechanically moved in the Y direction between the lowest position and the highest position during the beam scan (X direction scan).

Therefore, the D-shaped beam scan mentioned in FIG. 5, where the ion beam irradiation area is wider than a wafer area and the ion is surely irradiated on whole of the wafer 58, can not be realized, only by sequentially applying the scan voltage SV1, SV2, and SV3 to the beam deflection scanner 36 during the mechanical Y-scan of the wafer 58.

The beam scan control calculation unit implemented by the CPU shown in FIG. 2A is used to realize the above-mentioned D-shaped beam scan to the wafer 58 which is mechanically moved in the Y direction with the mechanical Y-scan.

Before description of the embodiment, a beam scan speed changing method by the scan voltage of the electrostatic type beam deflection scanner 36 will be explained in detail.

1) Although the scan voltage based on more than one corrected triangle waves shown in FIG. 4A, which is applied to the beam deflection scanner 36, is given by the beam scan voltage correction control functions 15, the corrected triangle waves can be defined by, for example, a scan period, start and end voltages, a peak voltage, and position and strength of perturbation from the basic triangle wave.

2) Based on the corrected triangle waves wherein the position and strength of perturbation from the basic triangle wave are determined with the constant period, the start and end voltages are newly set at the same basic value and the peak voltage is set at an arbitrary value (absolute voltage value different from the start and end voltages) and thereby the position and strength of perturbation from the basic triangle wave are changed with the constant period. This means that the beam scan speed is changed. When typically explaining by using the triangle wave for the sake of shorthand, approximately, a slope of the triangle wave is changed as shown in FIG. 4A and thereby the beam scan speed is changed.

In the above-mentioned beam scan speed changing method, although each scan voltage (V) is given by an initial set voltage value of a basic frequency in the corrected triangle wave shown in FIG. 4A, the corrected triangle wave for the initial set voltage value can be obtained, as a correction voltage value for the scan voltage, by the beam scan control calculation unit that calculates the position and strength of perturbation from the basic triangle wave by the use of data obtained with the beam measurement according to the beam current measurement device. The beam scan control calculation unit further generates the correction voltage value corresponding to each of the beam scan widths as an actual scan voltage value as a function of the beam scan width of the constant period by the use of the obtained correction voltage value for the scan voltage of the initial set voltage value.

FIG. 7 shows an example of the basic beam scan control function and the beam scan voltage correction control function depending on the beam measurement of the beam current measurement device 78 and an example of the initial set voltage value and the correction voltage value for the scan voltage and the actual scan voltage value both of which are calculated by using one of the scan voltage correction functions.

Figures 7A, 7B:
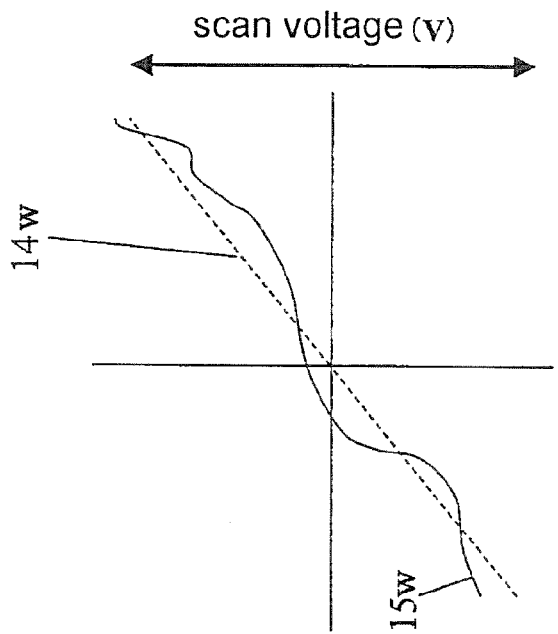
FIGS. 7A and 7B are diagrams showing one example of basic beam scan control function obtained by measurement of the scanned ion beam current by a beam current measurement device at an ion implantation position and a correction function of scan voltage according to this invention.

In FIG. 7A, it is supposed that the beam measurement of the beam current measurement device 78 is carried out at, for example, eleven positions within the maximum beam scan width and that the triangle wave of the basic frequency having the peak value SV1 shown in FIG. 3A is defined by eleven stages of the initial basic set voltage values −5(V), −4(V), −3(V), −2(V), −1(V), 0(V), 1(V), 2(V), 3(V), 4(V), and 5(V) depending on the basic beam scan control function 14. In this case, as the correction voltage values for the scan voltage which are calculated based on the beam scan voltage correction control function 15 by the use of the measurement result of the beam current measurement device 78, +0.3(V), +0.2(V), +0.2(V), +0.1(V), +0.1(V), 0(V), +0.1(V), +0.1(V), +0.2(V), +0.2(V), and +0.3(V) can be obtained in accordance with the basic triangle wave. As a result, the beam deflection scanner 36 is supplied with, as the actual scan voltage values, eleven stage of voltages −4.7(V), −3.8(V), −2.8(V), −1.9(V), −0.9(V), 0(V), 1.1(V), 2.1(V), 3.2(V), 4.2(V), and 5.3(V).

FIG. 7B schematically shows a relationship between the basic triangle wave 14$w$ obtained by using the initial basic set voltage values according to the basic beam scan control function 14 and the corrected triangle wave 15$w$ obtained by using the actual scan voltage values corrected according to the beam scan voltage correction control function 15. In case where a beam deflection scanner of magnetic type is used, it is configured that the beam scan speed is changed by periodically changing magnetic flux density to a magnetic apparatus of the beam deflection scanner and that the periodically changing of the magnetic flux density is executed by controlling triangle wave electrical current (or voltage for electric current control) supplied to the magnetic apparatus of the beam deflection scanner. Further, as is the case with the beam deflection scanner of the electrostatic type, the basic beam scan control function depending on the beam measurement of the beam current measurement device and the beam scan correction control function (voltage correction for current or voltage control) substantially equivalent to the scan voltage correction function are used.

As an example of the multistage setting of the beam scan width for the D-shaped beam scan, in case where the beam scan widths are set by, for example, four stages, under the condition of the constant period between the maximum beam scan width and the minimum beam scan width both inclusive, the beam scan control calculation unit automatically calculates four kinds of scan voltage correction functions, stores the calculated scan voltage correction functions in the RAM (or data memory device), generates the beam scan voltage correction control function 15 by changing the scan voltage correction function (namely, retrieve the calculated scan voltage correction functions from the RAM) depending on the mechanical Y-scan position, namely, each of the beam scan widths of the four stages, and then calculates the actual scan voltages to be supplied to the beam deflection scanner 36.

As described above, it is possible to reduce the beams scan width by changing the scan voltage correction function depending on the mechanical Y-scan position and by changing the beam scan width so as to match the outer periphery of a half of the wafer while keeping the dose uniformity in the horizontal direction (X direction). As a result, the beam scan area to the half of the wafer (multistage setting beam scan area) becomes the D-shaped scan area as explained in FIG. 5, the useless ion beam irradiation can be reduced. An area including another half of the wafer (upper side of FIG. 4B) is scanned with the ion beam of a constant beam scan width. Such a beam scan area may be called a constant beam scan area. In parallel with the above operation, the beam current in the constant beam scan area is measured with one of the side cups 76, and then the mechanical Y-scan speed of the mechanical Y-scan device is changed as a function of the change of the beam current depending on the reduction of the beam scan width to thereby keep the dose uniformity in the vertical direction (Y direction) in conjunction with the keep of the dose uniformity in the horizontal direction. As a result, the productivity of the wafer can improved while keeping the in-plane dose uniformity of the wafer.

As is easily understood from the above explanation, main technical features of the ion beam irradiation system or method of this invention are as follows.

1. After finishing beam tunings and before start of the ion implantation, the scan voltage correction function with the maximum beam scan width is calculated by using the beam measurement result according to the beam current measurement device with the maximum beam scan width. Depending on the calculated scan voltage correction function with the maximum beam scan width, more than one scan voltage correction functions corresponding to each of scheduled beam scan widths are automatically calculated while satisfying the dose uniformity in the horizontal direction, the calculated scan voltage correction functions are set to the beam scan control system, namely, are stored in the RAM (or data memory device).

2. The mechanical Y-scan position is measured during the ion implantation. By changing the scan voltage correction function as a function of the measured mechanical Y-scan position, it is configured so that the beam scan area for the half of the wafer becomes the D-shaped multistage setting beam scan area to thereby reduce the beam scan width and keep the dose uniformity in the horizontal direction.

3. In parallel with the above 2, the beam current value in the constant beam scan area is measured with one of the side cups 76. In order to keep good dose uniformity in the vertical direction, the mechanical Y-scan speed is changed as a function of changing of the measured beam current value.

4. According the above 2 and 3, a useless ion beam irradiation area can be reduced with keeping in-plane dose uniformity of the wafer.

EXAMPLE

Before start of the ion implantation, the beam scan control calculation unit (CPU in FIG. 2A) 1 obtains, by calculation, the scan voltage correction function with the maximum beam scan width by using the beam measurement result according to the beam current measurement device with the maximum beam scan width. Depending on the calculated scan voltage correction function, the beam scan control calculation unit automatically calculates more than one scan voltage correction functions that realize scheduled beam scan reduction while satisfying the dose uniformity in the horizontal direction (X direction) and stores the calculated more than one scan voltage correction functions in the RAM.

The dose amount irradiated to the wafer per unit time is increased with decreasing the beam scan width, because lower beam scan speed is set.

Further, the beam scan control calculation unit controls the mechanical Y-scan speed as a function of set beam current value in order to keep (ensure) good dose uniformity in the vertical direction (Y direction), Since the beam current is measured by using one side of the side cups 76 during the ion implantation to the wafer, the beam scan width in the constant scan area (i.e. left-half side in FIG. 5 or upper-half side in FIG. 4B) opposite to the D-shaped scan area is kept at a constant.

The beam scan control calculation unit changes the scan voltage correction function memorized in the RAM as a function of the measured mechanical Y-scan position and reduces the beam scan area so that the beam scan area corresponds to the half of the wafer with keeping the dose uniformity in the horizontal direction. As a result, the beam scan area for the half side of the wafer becomes the 0-shaped scan area.

Simultaneously, the beam current in the constant beam scan area is measured with one of the side cups 76 (i.e. the side cup 76 of upper side in FIG. 4B), and then the mechanical Y-scan speed is changed as a function of the change of the beam current depending on the reduction of the beam scan width to thereby keep the dose uniformity in the vertical direction. As a result, it is possible to reduce the ion implantation time with keeping the dose amount corresponding to the set beam current value and the in-plane dose uniformity. Therefore it is possible to improve the productivity and the throughput of the wafer.

The ion beam scan method described above for reduction of the beam irradiation area with a D-shape is called as a 0-SAVING function.

When the D-SAVING function is used, the following procedures are necessary after completion of the beam tuning operation.

(1) Before start of the ion implantation, the scan voltage correction function with the maximum beam scan width is calculated by using the beam measurement result from the beam current measurement device with the maximum beam scan width. Depending on the calculated scan voltage correction function, more than one scan voltage correction functions that realize scheduled beam scan reduction are automatically calculated while satisfying the dose uniformity in the horizontal direction (X direction).

(2) The calculated scan voltage correction functions are set to the beam scan control system, namely, are stored in the RAM (or data memory device).

Effects of the Example

According to the above example, it is possible to execute follow-up control which can be dealt with the beam fluctuation/dose amount fluctuation and to form the multistage setting beam scan area corresponding to fine ion implantation conditions in which the beam scan period is a constant and a combination between the beam scan speed in the X direction and the mechanical Y-scan speed in the Y direction is different, with satisfying the in-phase dose uniformity of the wafer.

According to the above example, it is possible to execute follow-up control which can be dealt with the beam fluctuation/dose amount fluctuation and to form the multistage setting beam scan area in which the beam scan period is a constant and the beam scan speed in the X direction, the mechanical Y-scan speed in the Y direction, and the beam scan width are different, with satisfying the in-phase dose uniformity of the wafer.

Figure 8:
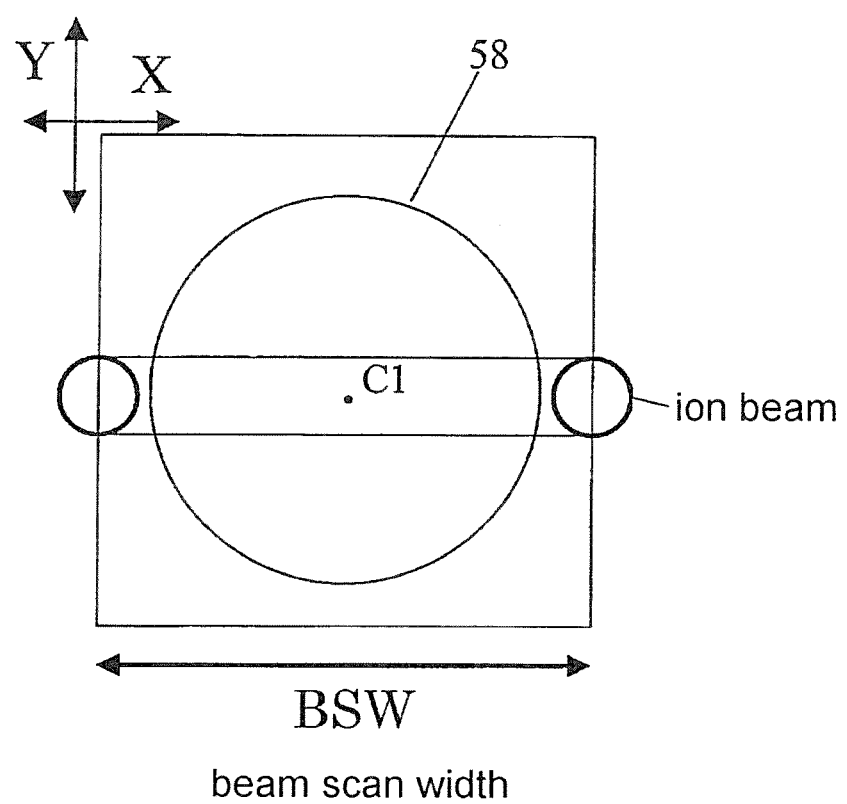
FIG. 8 is a diagram for explaining usual rectangular shape scan.

According to the above example, since the D-shaped beam scan area is adopted to match the shape of the wafer, it is possible to increase the productivity of the wafer by reduction of the beam scan area with keeping the in-plane dose uniformity, relative to the conventional rectangular beam scan area explained in FIG. 8. The beam scan width is automatically changed and the mechanical Y-scan speed of the wafer is also automatically changed as a function of the changing of the beam scan width.

Thus it is possible to reduce the ion implantation time by the use of the D-SAVING function relative to no use the D-SAVING function.

While this invention has been particularly shown and described with reference to exemplary embodiments and examples thereof, this invention is not limited to these embodiments and examples. It will be understood by those of ordinary skill in the art that various changes in form and details may be made therein without departing from the sprit and scope of the present invention as defined by the claims.

For example, depending on the beam measurement result of the side cups that measure the beam current of the scanned ion beam having the beam scan speed changed according to the multistage setting with the constant beam scan period, a basic speed of the mechanical Y-scan speed may be set and a mechanical Y-scan speed of the scan area of each of the multistage may be set, by calculation, corresponding to the dose amount set of the scan area of each of the multistage.

Also, this invention may be realized by the following aspects.

First Aspect

The scan voltage correction function with the maximum beam scan width is calculated by using the beam measurement result according to the beam current measurement device with the maximum beam scan width in a maximum scan range in which the beam scan speed is a maximum. Depending on the calculated scan voltage correction function with the maximum beam scan width, more than one scan voltage correction functions for controlling each of the beam scan speeds corresponding to each of predetermined multistage scan areas are generated. Generation of the scan voltage correction function is performed with anyone of followings.
1. Obtain the corrected scan voltage control functions from mathematically calculation based on the scan voltage correction functions with the maximum beam scan width.
2. Obtain the corrected scan voltage control functions by newly setting scan voltage correction functions and by correcting the new set scan voltage correction functions depending on the scan voltage correction functions with the maximum beam scan width.
3. Actually carry out the beam scan with the generated scan voltage correction functions generated by the above 1) or 2), carry out the correction of the generated scan voltage correction functions by using the beam measurement result of the beam current measurement device, and then obtain the further corrected scan voltage correction functions.

Second Aspect

After completion of beam tuning sequence and before start of the ion implantation, as the same as normal ion implantation, the scan voltage correction function with the maximum beam scan width is calculated by using the beam measurement result according to the beam current measurement device with the maximum beam scan width. Depending on the calculated scan voltage correction function with the maximum beam scan width, more than one scan voltage correction functions corresponding to each of scheduled beam scan amplitudes are automatically calculated while satisfying the dose uniformity in the horizontal direction, the calculated scan voltage correction functions are set to the beam scan control system, namely, are stored in the RAM (or data memory device).

Third Aspect

Depending on each of the beam scan control functions which become the basis according to each of the set beam scan widths, the beam scan is executed with the scanned beam according to each of the beam scan widths. The beam current measurement device measures the beam current in each of the scanned beams at the ion implantation position, and each of the scan voltage correction functions for the beam scan corresponding to each of the beam scan widths is obtained by the calculation.

Fourth Aspect

By setting the basic beam scan control functions for the scanned beams corresponding to the set beam scan widths depending on the basic beam scan control functions with the maximum beam scan range, newly scanned beams of each of the beam scan width are generated, and then the beam measurement is carried out at the ion implantation position. By using the measured beam current, the scan voltage correction functions for the beam scan in the X direction corresponding to each of the beam scan widths are obtained by the calculation.

Fifth Aspect

In consideration of the set values of the beam scan widths (the beams can width which over scans the left and right cup current measurement devices and the beam set left and right widths), each of the beam scan widths are set so that the beam scan distances from the beam scan start end are reduced in accordance with the multistage setting.

Sixth Aspect

It is possible to set more than one corrected triangle waves to the beam deflection scanner to realize the shape of the beam scan area which matches to the semicircular shape of which the radius is larger than that of the wafer, to prevent small influence due to finite width of the ion beam.

Seventh Aspect

The multistage beam scan areas which are different in beam scan speed are set in the Y direction, and the scan voltage correction functions are set in each of the multistage beam scan areas.

Eighth Aspect

The scan voltage control correction functions of each of the multistage beam scan areas can be generated as approximate functions from the calculation result of the scan voltage correction functions in the beam scan range with the maximum scan speed, or can be generated from the calculation of the scan voltage correction functions in each of the multistage beam scan areas, or can be generated by previously setting the scan voltage correction functions of each of the multistage beam scan areas.

What is claimed is:
1. An ion beam irradiation method for use in an ion implanter comprising a beam deflection scanner that scans a wafer with an ion beam at a beam scan speed in an X direction, a beam parallelizing device, and a wafer mechanical scan device that moves the wafer at a wafer mechanical scan speed in a Y direction orthogonal to the X direction so as to irradiate the wafer with the ion beam, wherein the method comprises:
 setting multistage beam scan areas of the wafer in the Y direction for ion implantation and setting beam scan widths in the X direction in each of the multistage beam scan areas;
 changing a combination of the beam scan speed by the beam deflection scanner and the wafer mechanical scan speed by the wafer mechanical scan device as a function of each of the beam scan widths so as to keep a dose uniformity in the X direction;
 setting a same beam scan frequency to all of the multistage beam scan areas and automatically changing the wafer mechanical scan speed as a function of the change of the beam scan speed; and configuring the beam deflection scanner and the wafer mechanical scan device so that each of the multistage beam scan areas which are different in beam scan widths has a same dose amount of the ion beam, by using different combinations of the beam scan speed and the wafer mechanical scan speed.

2. The ion beam irradiation method according to claim 1, wherein the method further comprises:
setting a beam scan control function for adjusting the beam scan speed in the X direction, maintaining the beam scan control function in each of the multistage beam scan areas, and controlling the beam deflection scanner based upon the beam scan control function to keep the dose uniformity in the X direction.

3. The ion beam irradiation method according to claim 2, wherein the ion implanter further comprises a beam current measurement device arranged in the vicinity of an ion implantation position of the wafer so as to be movable between the beam scan area and an evacuation position to measure a beam current of the ion beam at each position of the beam scan area in the X direction,
the method further comprising:
setting a basic beam scan control function based upon the beam scan control function with a maximum beam scan width among the multistage beam scan areas; and
calculating the basic beam scan control function, as the calculated basic beam scan control function, on the basis of a relation between each position of the beam current measurement device in the X direction and the beam measurement result of the beam current measurement device.

4. The ion beam irradiation method according to claim 3, wherein the method further comprises:
calculating, on the basis of the basic beam scan control function, each of the beam scan control functions of each of other beam scan areas except for the beam scan area on which a beam scan width among the multistage beam scan areas is a maximum.

5. The ion beam irradiation method according to claim 2, wherein the ion implanter further comprises a beam current measurement device arranged in the vicinity of an ion implantation position of the wafer so as to be movable between the beam scan area and an evacuation position in order to measure a beam current of the ion beam at each position of the beam scan area in the X direction,
the method further comprising:
calculating the beam scan control function of each of the multistage beam scan areas on the basis of a relation between each position of the beam current measurement device in the X direction and the beam measurement result of the beam current measurement device.

6. The ion beam irradiation method according to claim 2, wherein the ion implanter further comprises a side cup current measurement device arranged at a beam scan position corresponding to at least one of the ends in the X direction of the wafer at an upstream side of the wafer to measure a beam current during ion implantation into the wafer,
the method further comprising:
measuring with the side cup current measurement device part of the ion beam irradiated onto each of the multistage beam scan areas which are different in beam scan width; and
carrying out a dose control by adjusting the wafer mechanical scan speed on the basis of the measured beam current measured with the side cup current measurement device.

7. The ion beam irradiation method according to claim 6, wherein the multistage beam scan areas which are different in beam scan width are formed so that the beam scan widths on one side of two wafer regions divided by a straight line including a wafer diameter in the Y direction are adjusted so as to change along an outer periphery of the one side of the two wafer regions, to thereby set the multistage beam scan areas for the one side of the two wafer regions to a D-shape and to thereby reduce the beam scan width, the one side of the two wafer regions being on a side opposite to the at least one of the ends at which the side cup current measurement device is arranged.

* * * * *